United States Patent
Chen et al.

(10) Patent No.: US 8,159,044 B1
(45) Date of Patent: Apr. 17, 2012

(54) DENSITY TRANSITION ZONES FOR INTEGRATED CIRCUITS

(75) Inventors: Shuxian Chen, Fremont, CA (US);
Fangyun Richter, San Jose, CA (US);
Bradley Jensen, San Jose, CA (US);
Yowjuang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 266 days.

(21) Appl. No.: 12/623,161

(22) Filed: Nov. 20, 2009

(51) Int. Cl.
*H01L 29/00* (2006.01)

(52) U.S. Cl. .................. 257/531; 257/516; 257/528

(58) Field of Classification Search .................. 257/516, 257/528, 531, E27.001
See application file for complete search history.

(56) References Cited

U.S. PATENT DOCUMENTS

| | | | |
|---|---|---|---|
| 5,446,311 A | 8/1995 | Ewen et al. | |
| 6,287,931 B1 | 9/2001 | Chen | |
| 6,362,012 B1 | 3/2002 | Chi et al. | |
| 6,611,188 B2 | 8/2003 | Yeo et al. | |
| 7,135,951 B1 | 11/2006 | Sidhu et al. | |
| 7,262,481 B1 * | 8/2007 | Marques | 257/531 |
| 2002/0158306 A1 | 10/2002 | Niitsu | |
| 2003/0234436 A1 | 12/2003 | Hsu | |
| 2010/0193904 A1 * | 8/2010 | Watt et al. | 257/531 |

OTHER PUBLICATIONS

Yue, C. Patrick et al. "On-Chip Spiral Inductors with Patterned Ground Shields for Si-Based RF IC's." IEEE Journal of Solid-State Circuits, vol. 33, No. 5, p. 743-752, May 1998.
Chen, Y. Emery et al. "Q-Enhancement of Spiral Inductor with N+-Diffusion Patterned Ground Shields." Microwave Symposium Digest, 2001 IEEE MTT-S International, vol. 2, p. 1289-1292, 2001.
Yue, C. Patrick et al. "Design Strategy of On-Chip Inductors for Highly Integrated RF Systems." Proceedings of the 36th ACM/IEEE conference on Design automation. p. 982-987, 1999.
Watt, Jeffrey et al. U.S. Appl. No. 12/363,545, filed Jan. 30, 2009.

* cited by examiner

*Primary Examiner* — Phuc Dang
(74) *Attorney, Agent, or Firm* — Treyz Law Group; G. Victor Treyz; Nancy Y. Ru

(57) ABSTRACT

An integrated circuit is provided with a spiral inductor and a transition zone surrounding the spiral inductor. The transition zone may have a geometry that is substantially eight-sided or octagonal. Metal layers in the transition zone may have metal fill that is substantially octagonal and arranged in rows and columns. If desired, square or rectangular metal fill be tiled with the substantially octagonal metal fill. Metal layers may also contain halved or quartered octagonal metal fill. Substrate in the transition zone may have octagonal substrate regions separated by shallow trench isolation regions. A polysilicon layer above the substrate may have square regions of polysilicon fill directly above the shallow trench regions in the substrate. Such arrangements may provide more uniform densities in transition zones with certain geometries.

20 Claims, 17 Drawing Sheets

| | ACTIVE COMPONENT REGION | TRANSITION ZONE | INDUCTOR REGION |
|---|---|---|---|
| 24 — METAL LAYERS | HIGHER METAL DENSITY | MEDIUM METAL DENSITY | LOWER METAL DENSITY |
| 22 — POLYSILICON LAYER | HIGHER POLYSILICON DENSITY | MEDIUM POLYSILICON DENSITY | LOWER POLYSILICON DENSITY |
| 20 — SUBSTRATE | LOWER STI DENSITY | MEDIUM STI DENSITY | HIGHER STI DENSITY |

FIG. 4

DENSITY TRANSITION ZONES FOR INTEGRATED CIRCUITS

BACKGROUND

This invention relates to integrated circuits, and more particularly, to density transition zones surrounding circuits such as spiral inductors.

When inductors are formed on integrated circuits, it may be desirable to shield, insulate, or otherwise prevent stray magnetic fields from the inductor from reaching other components on the integrated circuit. Integrated circuit inductors are often formed in the upper layers of an integrated circuit's dielectric stack in order to maximize the distance between the inductor and the substrate. Dielectric stack layers that lie between the inductor and the substrate may be mostly or entirely filled with a dielectric material such as silicon oxide. As a result, dielectric stack layers in the vicinity of the inductor may have a lower metal density, or no metal density, and a higher oxide density compared to surrounding areas on the integrated circuit.

During integrated circuit fabrication, processes such as chemical-mechanical planarization (CMP), also known as chemical-mechanical polishing, may be affected by differences in metal density on the integrated circuit. As metal tends to be softer than oxide, regions with higher metal density may polish down faster than regions with lower metal density. As a result, dielectric stack layers in the vicinity of an inductor, having lower metal density, may be thicker than dielectric stack layers in surrounding areas on the integrated circuit.

Such non-uniformity in stack thickness may adversely affect components on the integrated circuit, especially in areas immediately adjacent to the inductor, where dielectric layers may rapidly transition from thicker to thinner layers. One common approach for addressing this issue is to designate a transition zone (also known as a "density transition zone) around the inductor. No active components are usually formed in the transition zone. Instead, metal layers in the transition zone have a certain amount of inactive metal fill (also known as "dummy metal" or "dummy fill"). The dummy metal ensures that metal layers in the transition zone have a metal density that is intermediate between that of the inductor and that of the surrounding regions that contain active components. The transition zone helps provide a smooth transition between the thicker dielectric stack layers of the inductor and the thinner dielectric stack layers in surrounding regions of the integrated circuit.

However, certain inductor and transition zone geometries may present a challenge in providing a uniform distribution of metal and dielectric materials within a transition zone. Such geometries may include transition zones with angles greater than 90 degrees, such as 135 degree angles. Conventional transition zones with these geometries have exhibited non-uniformities in their dummy metal patterns.

SUMMARY

Transition zones for inductors are provided that have a uniform density for transition zone geometries with non-perpendicular angles along zone boundaries.

Transition zones may have a substantially eight-sided or octagonal geometry. A transition zone may surround an inductor that also has substantially eight-sided or octagonal geometry. A transition zone of this type may have boundary segments oriented at angles that are greater than 90 degrees, such as 135 degree angles.

Metal layers in the transition zone may be provided with metal fill with a substantially eight-sided or octagonal geometry. The octagonal metal fill may be arranged in rows and columns. If desired, square or rectangular metal fill may be tiled with octagonal metal fill in the metal layers. Metal fill in the metal layers may be separated by dielectric material such as silicon oxide. The size and separation of metal fill may be adjusted to provide a desired metal-oxide density for metal layers in the transition zone.

Substrate in the transition zone may be provided with substrate regions that are substantially eight-sided or octagonal. The substrate regions may be separated by shallow trench isolation (STI) regions. As a result, the substrate regions are sometimes referred to as non-STI regions. A polysilicon layer over the substrate may be provided with a square or rectangular polysilicon fill pattern. Polysilicon fill structures may be positioned directly over the regions of shallow trench isolation in the substrate.

Further features of the invention, its nature, and various advantages will be more apparent from the accompanying drawings and the following detailed description.

BRIEF DESCRIPTION OF THE DRAWINGS

FIG. 4 is a table showing relative metal, polysilicon, and shallow trench isolation densities in the vicinity of an inductor, in a transition zone, and in surrounding areas on an integrated circuit in accordance with an embodiment of the present invention.

DETAILED DESCRIPTION

The present invention relates to transition zones surrounding integrated circuit inductors.

Figure 1:
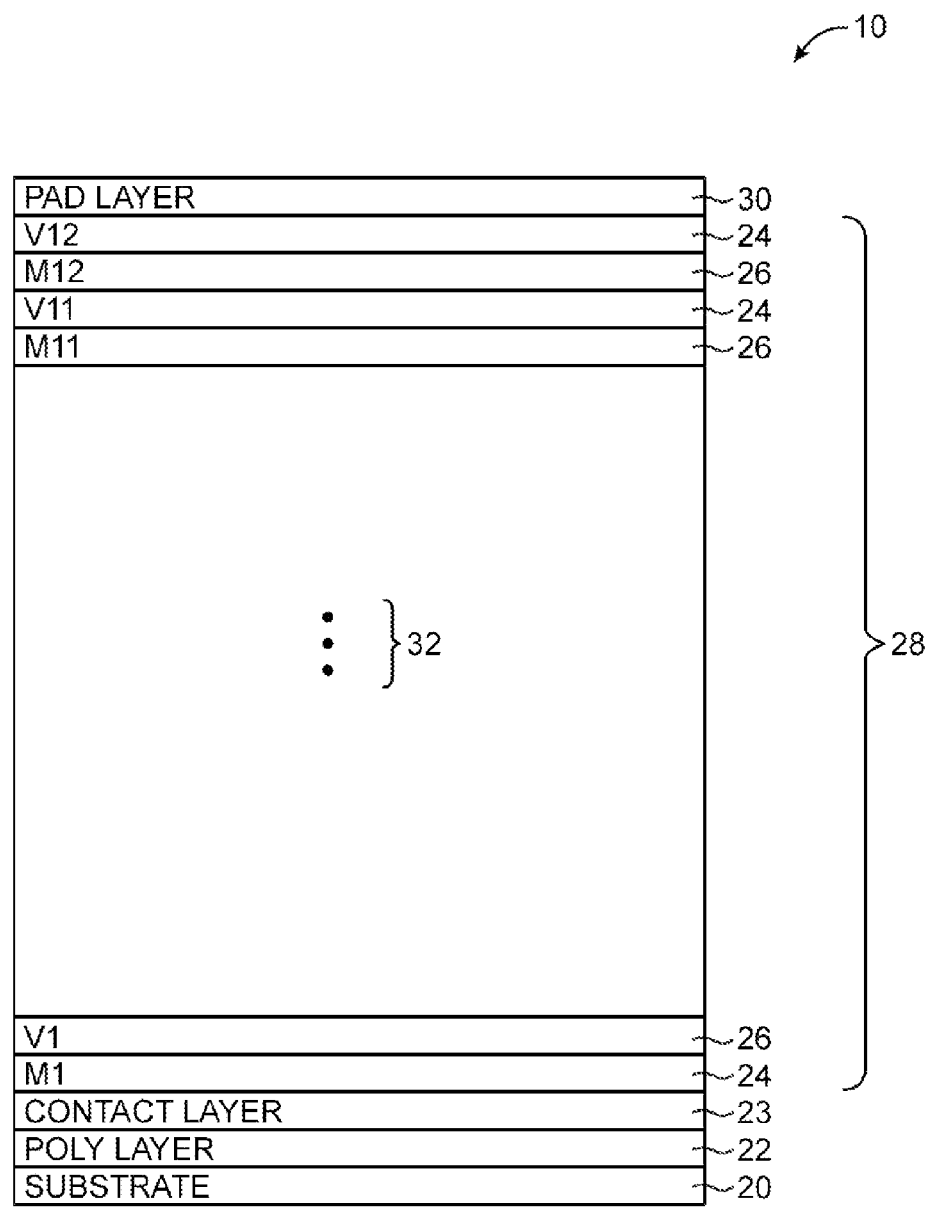
FIG. 1 is a cross sectional side view of an integrated circuit dielectric stack in accordance with an embodiment of the present invention.

A cross sectional side view of an integrated circuit 10 is shown in FIG. 1. Integrated circuit 10 has substrate 20. Substrate 20 may be a silicon substrate. Substrate 20 may be a p-type substrate or an n-type substrate. Active components may be formed in substrate 20. Above substrate 20 is a polysilicon layer 22 that may be used to form conductive regions for devices located in substrate 20. Contact layer 23 may be formed above polysilicon layer 22. Dielectric stack 28 may be formed above contact layer 23.

Dielectric stack 28 may contain alternating metal layers 24 and via layers 26. Additional metal layers 24 and via layers 26 are denoted by dots 32. Metal layers 24 may be used to form conductive paths between devices on integrated circuit 10. Via layers 26 may contain short vertical conductive "vias" that form connections between conductive paths in metal layers 24.

The conductive materials in metal layers 24 and via layers 26 may be copper, tungsten, aluminum, or any other suitable conductive materials. Dielectric material, such as silicon oxide, typically surrounds conductive paths in metal layers 24 and conductive vias in via layers 26. Metal layers 24 are typically numbered "M1, M2 . . . " beginning with metal layer M1 closest to substrate 20. Via layers 26 are typically numbered "V1, V2 . . . " beginning with the V1 via layer 26 closest to substrate 20. FIG. 1 shows twelve metal layers 24 and twelve via layers 26, but in general there may be any suitable number of metal layers 24 and via layers 26 in dielectric stack 28. Pad layer 30 may lie above a topmost metal layer 24 or a topmost via layer 26. Pad layer 30 may be an aluminum copper layer or other conductive layer used for forming contact pads.

Figure 2:
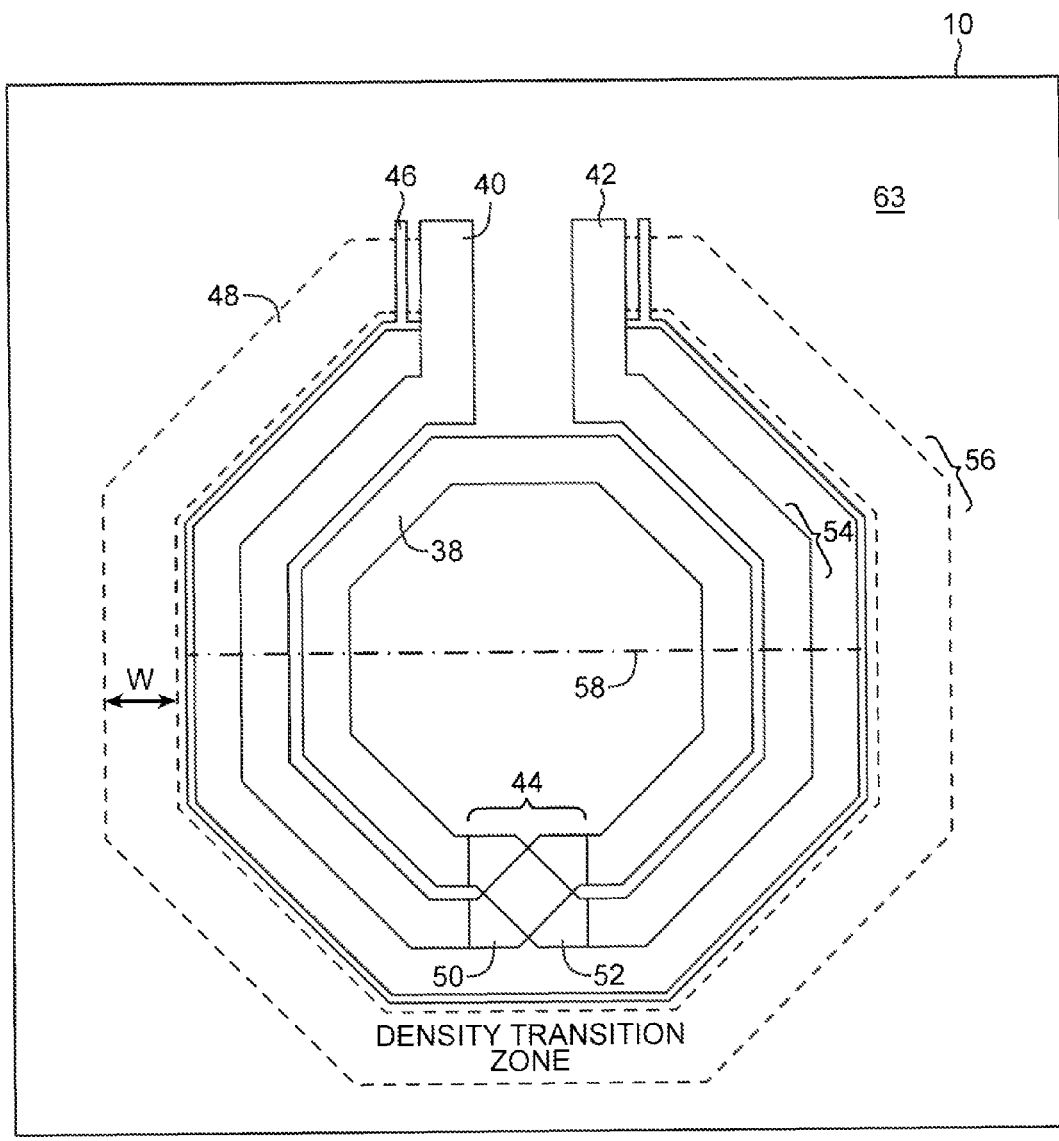
FIG. 2 is a top view of an illustrative spiral inductor surrounded by a transition zone in accordance with an embodiment of the present invention.

An illustrative spiral inductor 38 on integrated circuit 10 with a transition zone 48 is shown in FIG. 2. Spiral inductor 38 may be formed in one or more of the uppermost layers of dielectric stack 28. For example, spiral inductor 38 may be formed in pad layer 30, metal layer M12, and metal layer M11 (see, e.g. FIG. 1). Portions of spiral inductor 38 in different metal layers 24 may be connected by vias. Spiral inductor 38 may have terminals 40 and 42 through which a signal may be supplied to inductor 38 from circuitry on device 10. Spiral inductor 38 may have one or more spirals. In the example of FIG. 2, spiral inductor 38 is shown as having two spirals. When spiral inductor 38 has more than one spiral, there may be a region 44 where the spirals cross. In such a region 44, when spiral inductor 38 is formed in multiple metals layers 24, overlapping segments 50 and 52 may each be formed in only one metal layer 24 in order to avoid shorting inductor 38 in region 44.

In FIG. 2, inductor 38 is shown as being formed of straight segments that are linked to together to form an eight-sided geometry. Spiral inductor 38 may have a substantially octagonal shape. In this type of configuration, the edges of spiral inductor 38 form angles such as angle 54 that are 135 degree angles or are close to being 135 degree angles. Inductor 38 of FIG. 2 is merely an example. In general, inductor 38 may have any suitable geometry. Inductor 38 need not have an eight-sided geometry but could have, for example, a six-sided or ten-sided geometry. Inductor 38 may have edge segments at angles that are 100 degrees, 150 degrees, or any other suitable angle.

Spiral inductor 38 may be of any suitable size. Spiral inductor 38 may, for example, have a diameter of 100 microns or more, 200 microns or more, 500 microns or more, or any other suitable diameter. Spiral inductor 38 may be used as a radio-frequency choke or may be used in resonant circuits (as examples). An integrated circuit may have multiple inductors of different sizes and types each of which has a geometry of the type shown in FIG. 2.

Figure 3:
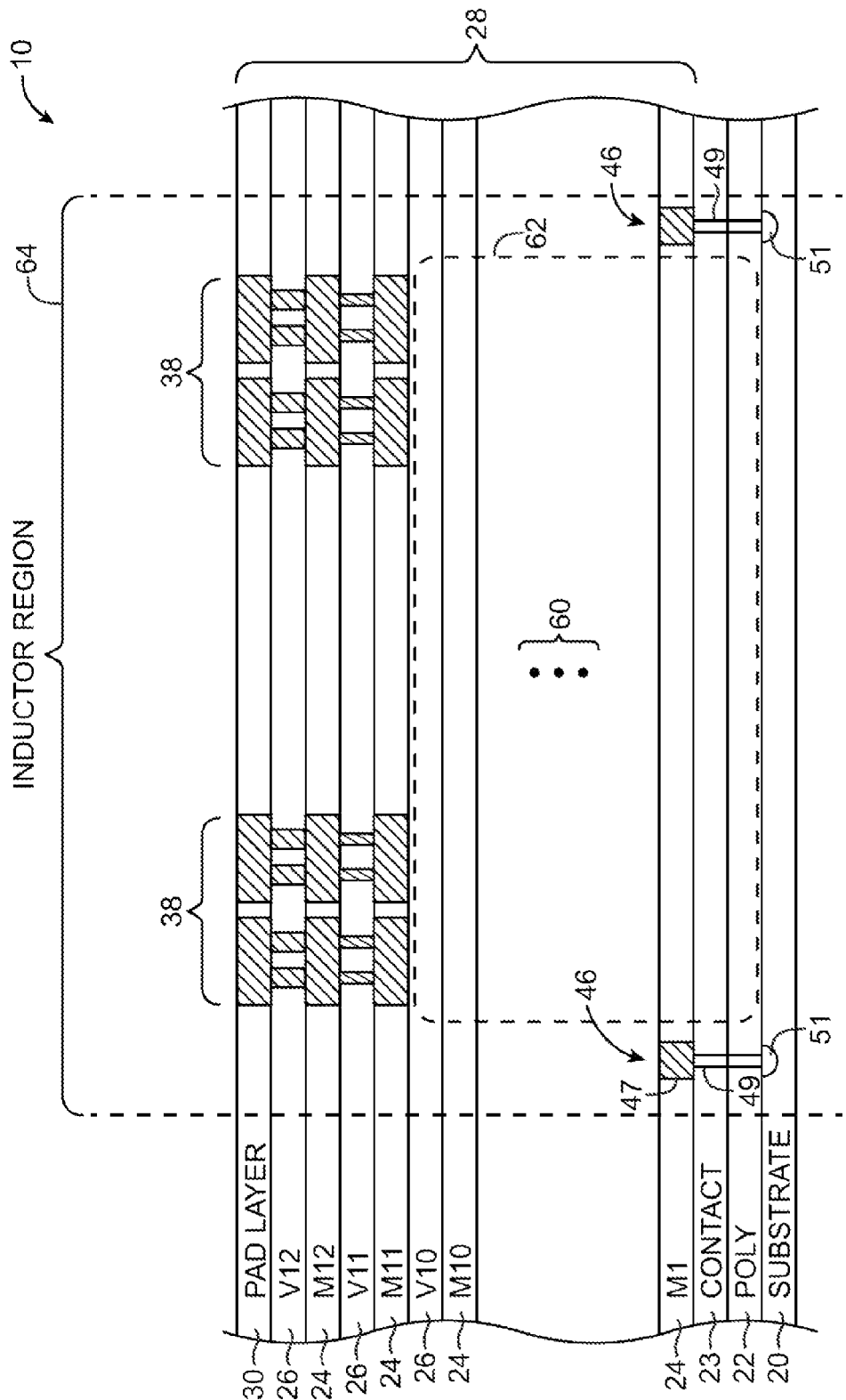
FIG. 3 is a cross sectional side view of an illustrative inductor formed in an integrated circuit dielectric stack in accordance with an embodiment of the present invention.

A guard ring such as guard ring 46 may be formed around the perimeter of inductor 38. As shown in FIG. 3, guard ring 46 may have a ring-shaped n-type diffusion region 51 in p-type substrate 20 and a metal ring 47 in the M1 metal layer. Conductive structures 49 (e.g., poly and/or contact metal structures) may be used to connect structures 47 and 51. Structure 47 may be grounded. In the example of FIGS. 2 and 3, guard ring 46 has the same geometry as inductor 38, e.g., guard ring 46 has an eight-sided, substantially octagonal geometry. In general, guard ring 46 may have any suitable geometry. Guard ring 46 may help short out eddy currents that have been induced in substrate 20 by inductor 38.

A transition zone 48 surrounds inductor 38 and guard ring 46. Transition zone 48 of FIG. 2 may have a similar geometry to that of inductor 38, e.g., transition zone 48 may have a substantially eight-sided or octagonal geometry. Transition zone 48 may have inner and outer boundaries with angles such as angle 56 that are at 135 degrees or nearly 135 degrees. Transition zone 48 may be formed from eight straight segments that are joined at 135 degree angles. Transition zone 48 may have any suitable width W. Transition zone may have, for example, a width of 0-25 microns, 10-25 microns, greater than 10 microns, less than 25 microns, or other suitable widths.

The portions of integrated circuit 10 that surround transition zone 48 generally contain active components. Such regions are therefore sometimes referred to as active component regions 63.

In transition zone 48, the densities of metal and dielectric material in metal layers 24, the patterns of polysilicon and dielectric material in polysilicon layer 22, and the patterns of shallow trench isolation (STI) and non-STI regions in substrate 20 (see, e.g., FIG. 1) are configured to provided a smooth transition between the active regions 63 and inductor 38. Transition zone 48 typically does not contain any active components.

A cross sectional view of inductor 38 taken through line 58 in FIG. 2 is shown in FIG. 3. In order to minimize undesired substrate coupling effects, an integrated circuit inductor is often formed in one or more of the highest layers of a dielectric stack 28 of an integrated circuit 10. This maximizes the distance between the inductor and substrate 20. Forming an inductor in more than one metal layers may help reduce a series resistance of the inductor. In the example of FIG. 3, the spirals of inductor 38 are formed in pad layer 30, metal layer M12 and metal layer M11. Vias in via layers V12 and V11 connect the layers of inductor 38. Additional layers in dielectric stack 28 are denoted by dots 60. Guard ring 46 may surround inductor 38. The portion of integrated circuit 10 that contains inductor 38 may be referred to as inductor region 64.

Portions of metal layers 24 and vias layers 26 that lie below inductor 38, i.e. in region 62, may be completely or nearly completely filled with dielectric material such as silicon oxide. There may be little or no metal in region 62 in order to avoid undesired electromagnetic interaction with the magnetic fields of inductor 38. (If desired, a conductive shield may be provided on substrate 20 or on one of the lowermost metal layers 24 to shield substrate 20 from inductor 38.) As a result of avoiding metal in region 62, metal layers 24 in region 62 underneath inductor 38 have a lower metal density and a higher oxide density than other portions of integrated circuit 10. Upper metal layers that contain portions of the inductor spiral (such as metal layer M12 and M11 in the example of FIG. 3) may also have a lower metal density than surrounding areas on the integrated circuit, due to there being little or no metal within the spiral of inductor 38.

FIG. 4 is a table showing the relative densities of different materials on an illustrative integrated circuit. Three integrated circuit regions are shown on the chart of FIG. 4. Inductor region 64 includes metal layers 24 and via layers 26 containing inductor 38 and lying beneath inductor 38, and substrate 20 and polysilicon layer 22 beneath inductor 38. Transition zone 48 immediately surrounds an inductor region 64 and serves as an interface between an inductor region 64 and active component region 63. Active component region 63 includes areas on integrated circuit 10 other than inductor region 64 and transition zone 48 with a particular emphasis on active component regions 63 immediately adjacent to transition zone 48.

In inductor region 64, metal layers 24 may have lower metal density (and higher oxide density) than metal layers 24 in active component region 63. Metal layers 24 that contain the spirals inductor 48 may have, for example, 20% metal (by volume or by area). Metal layers 24 that lie below an inductor may have no metal, or a small amount of metal, such as 10% metal. Metal layers 24 in active component region 63 may have higher metal density and lower oxide density as compared to inductor region 64. The exact metal density of metal layers in active component regions may vary from region to region on an integrated circuit and may depend on the type of components that are formed in a specific region. Metal layers in active component regions may have, for example, 40-60% metal.

During processes such as chemical-mechanical polishing (CMP), areas that have different densities may have different polishing rates. Areas with a high density of metal tend to polish faster than those with a high density of silicon oxide. For example, metal layers 24 in inductor region 64 having less metal and more silicon oxide may polish slower than active component regions 63 that have more metal and less oxide. As a result, it may be desirable to have transition zone 48 having densities intermediate between that of inductor region 64 and active component region 63. The use of transition zone 48 helps avoid processing issues that might arise from an overly sharp discontinuity between inductor region 64 and active regions 63.

Metal layers in transition zone 48 may have, for example 45-55% metal. This range is merely illustrative. Transition zone 48 may have any suitable metal density. For example, transition zone 48 may have 30% metal, 70% metal, less than 60% metal, greater than 40% metal, or any other suitable metal density. Each metal layer 24 in transition zone 48 may have the same metal density, or metal density may be varied between metal layers 24. If desired, metal density may also be varied in different areas of transition zone 48 depending on the makeup of adjacent active component regions 63.

Polysilicon layer 22 may have a lower polysilicon density in inductor region 64 than in active component regions 63. Polysilicon layer 22 in inductor region 64 may have, for example, 0-10% polysilicon. In active component region 63, polysilicon layer 22 might have, for example, 5-70% polysilicon, depending on the type of components in the region. Polysilicon layer 22 in transition zone 48 might be provided with an intermediate amount of polysilicon, such as 25-35% polysilicon. These polysilicon density ranges are merely illustrative. Polysilicon layer 22 in transition zone 48 may have any suitable polysilicon density. Polysilicon layer 22 in transition zone 48 may have, for example, greater than 10% polysilicon, greater than 20% polysilicon, less than 10% polysilicon, less than 50% polysilicon, or any other suitable amount of polysilicon.

Substrate 20 in inductor region 64 may have a higher density of shallow trench isolation (STI) and a lower density of non-STI regions compared to substrate 20 in active component region 63. For example, substrate 20 in an inductor region may be completely filled, or nearly filled, with shallow trench isolation. In active component region 63, substrate 20 might have 20-80% shallow trench isolation. In transition zone 48, substrate 20 may be provided with an intermediate amount of shallow trench isolation, such as 70% shallow trench isolation and 30% active regions. In general, substrate 20 in density transition zone 48 may be provided any suitable density of shallow trench isolation, such as 50% shallow trench isolation and 50% active regions, less than 80% shallow trench isolation and greater than 20% active regions, or any suitable ration of shallow trench isolation and active regions.

In order to form transition zones with a certain density of a particular material, pieces of the material may be distributed as uniformly as possible throughout the transition zone. These pieces of material are not actively used in the circuitry of integrated circuit 10 and may therefore be referred to as fill or dummy fill. In metal layers 24, metal fill, such as copper fill, may be used. In a polysilicon layer 22, polysilicon fill may be used. In substrate 20, active regions may serve as the "fill," and/or shallow trench isolation may be thought of as serving as the dummy material. In a transition zone surrounding an inductor, the dummy fill structures may be required to have a certain minimum size. For example, dummy metal fill structures may be required to be at least three microns by three microns to satisfy semiconductor fabrication design rules. This requirement can lead to irregular fill patterns when conventional fill structures are used in octagonal transition zones.

Figures 5A, 5B:
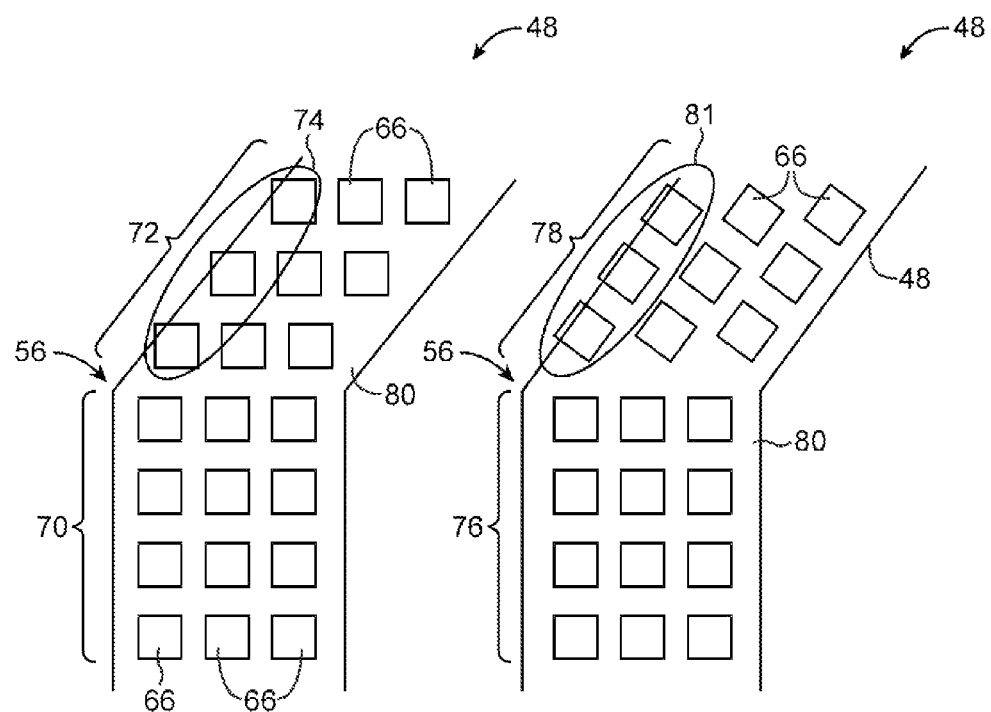
FIG. 5A is a top view of a transition zone having conventional rectangular dummy fill that is oriented in the same direction across an angle in the transition zone.
FIG. 5B is a top view of a transition zone containing conventional rectangular dummy fill in which the rectangular dummy fill changes orientation at an angle in the transition zone.

FIGS. 5A and 5B show examples of density transition zone 48 having conventional square- or rectangular-shaped fill. FIG. 5A shows an segment of a transition zone such as a transition zone 48 of FIG. 2. Square-shaped fill 66 may be regularly interspersed in rows and columns throughout transition zone 48. In a metal layer 24, fill 66 may be metal fill and the region 80 between the fill may be a dielectric material such as silicon oxide.

Transition zone 48 may have edge segments at angles that are not right angles. Transition zone 48 may have, for example, boundaries with 135 degree angles such as angle 56. Square-shaped fill 66 might not provide an adequately uniform fill when transition zone 48 has angles such as a 135 degree angle. For example, in the bottom portion 70 of transition zone 48 in FIG. 5A, square-shaped fill 66 are positioned in rows and columns and are parallel to the sides of transition zone 48. However, in top portion 72, square-shaped fill 66 are no longer aligned with the sides of transition zone 48. As a result, some of the fill 66, such as those in region 74, have corners that lie outside of the borders of transition zone 48. In transition zone 48 surrounding an inductor 38 (see, e.g., FIG. 2), dummy fill may be required to have a certain minimum size to satisfy fabrication process design rules, so that it may not be possible to use smaller pieces of dummy fill in order to create a more uniform density in transition zone 48.

FIG. 5B shows another conventional layout for transition zone 48. Square-shaped fill 66 may be metal fill 66 surrounded by oxide 80. Transition zone 48 of FIG. 5B also has an angle 56 that is approximately 135 degrees. In the example of FIG. 5B, square-shaped fill structures 66 in bottom portion 76 of transition zone 48 are aligned parallel to the sides of transition zone 48. In top portion 78, square-shaped fill structures 66 are rotated so that the sides of square-shaped fill structures 66 are parallel to the borders of transition zone 48 of top portion 78. However, in the layout of FIG. 5B, some of the square-shaped fill structures 66, such as square-shaped fill in region 81, lie outside the borders of transition zone 48.

Figure 6:
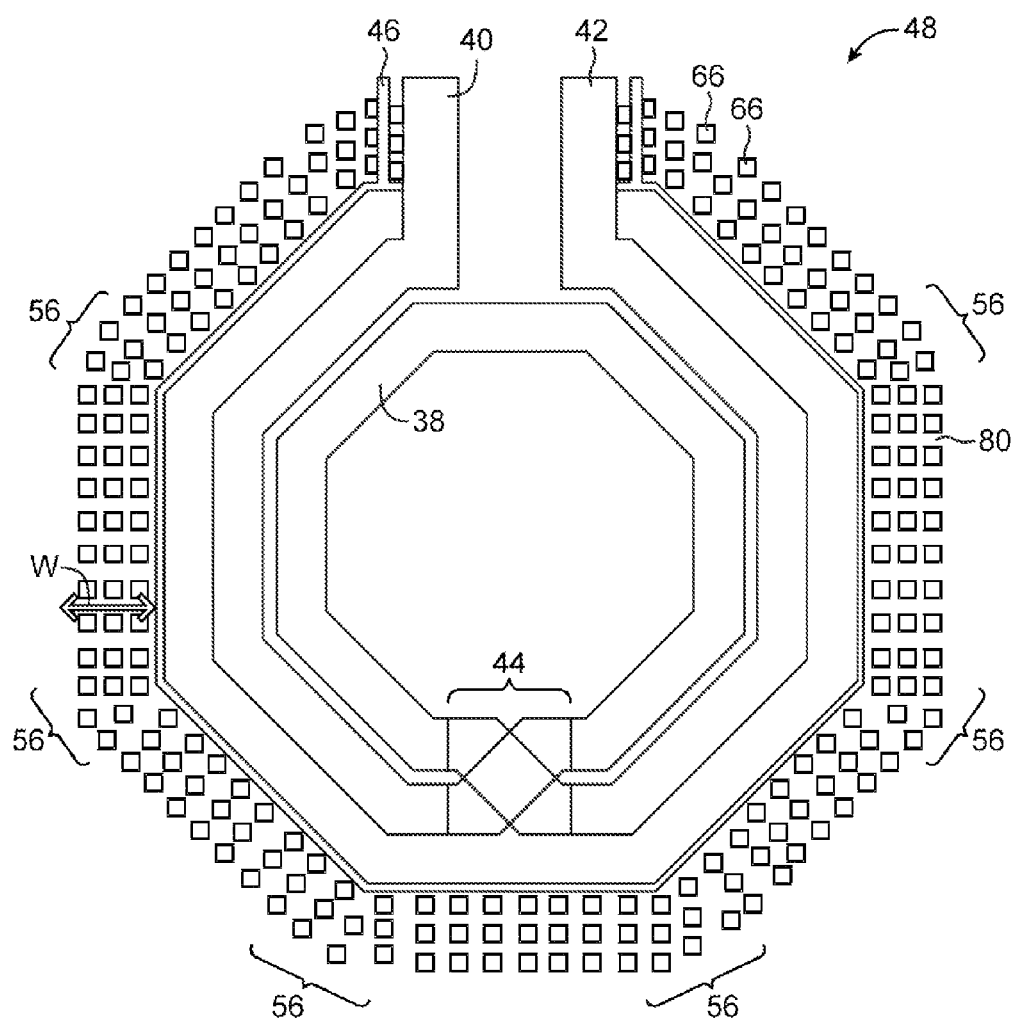
FIG. 6 is a top view of a spiral inductor surrounded by a transition zone having conventional dummy fill.

FIG. 6 is a top view of an octagonal-shaped inductor 38 surrounded by a transition zone 48 having conventional square-shaped fill 66. In metal layers 24, square-shaped metal fill 66 is surrounded by silicon oxide 80. Inductor 38 has terminals 40 and 42 and a crossover region 44. A guard ring 46 surrounds inductor 38. Transition zone 48 is octagonal with corners 56 that are 135 degrees. Transition zone 48 has a width W. Square shaped fill 66 is distributed throughout transition zone 48. Because fill 66 is square and transition zone 48 is substantially octagonal, it is difficult to distribute fill 66 uniformly in corners 56 of transition zone 48.

Figure 7:
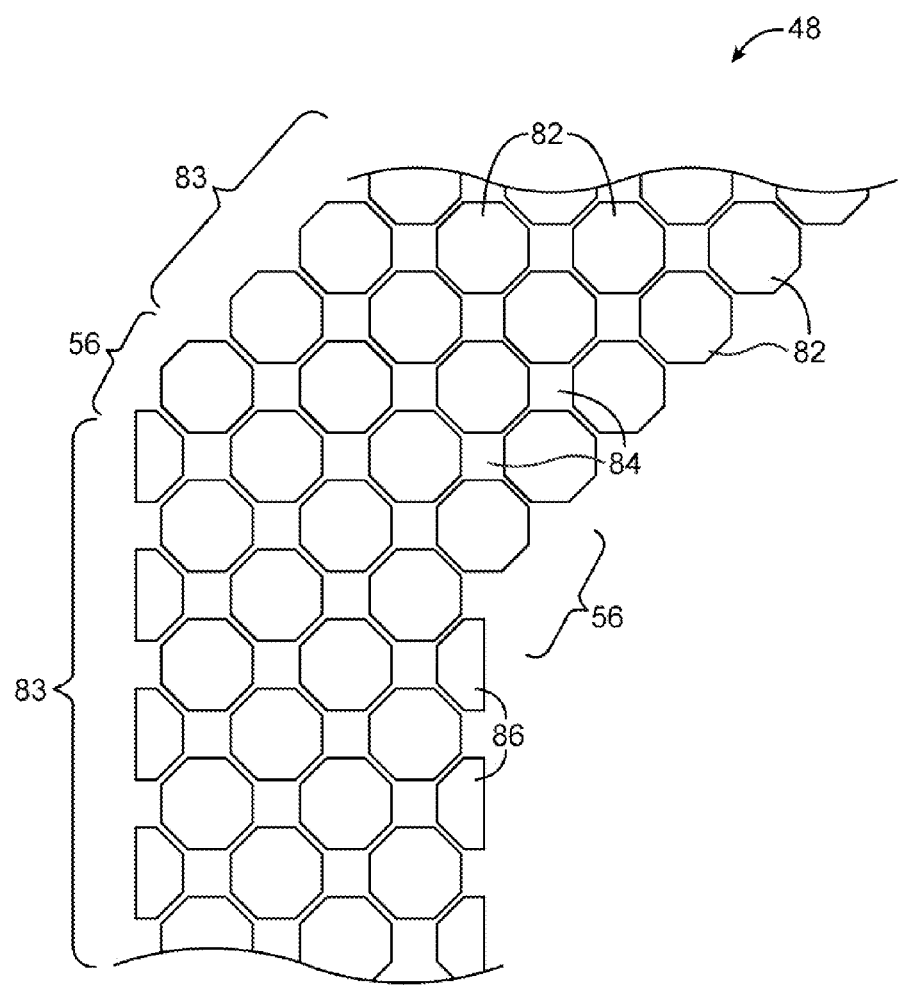
FIG. 7 is a top view of a transition zone having octagonal dummy metal fill with a first layout in accordance with an embodiment of the present invention.

These difficulties are addressed using non-square fill. FIG. 7 is a top view of an illustrative portion of a transition zone 48 having substantially eight-sided or octagonal fill 82. Octagonal fill 82 may be aligned in rows and columns. Regions 84 between fill 82 may be substantially square-shaped. In a metal layers 24, octagonal fill 82 may be octagonal metal fill 82 and regions 84 between octagonal metal fill 82 may be formed from a dielectric material such as silicon oxide. Octagonal metal fill 82 may be arranged in rows and columns. By using octagonal fill 82, uniformity of fill may be preserved at corners 56 of transition zone 48. In the example of FIG. 7, some of octagonal fill 82 may be halved in order to better fit transition zone 48, such as halved octagonal fill 86 near a border of transition zone 48. There may be halved octagonal fill 86 present in one segment 83 of transition zone 48 on one side of corner 56, and no halved octagonal fill 86 present in other segment 85 of transition zone 48, on another side of corner 56.

The arrangement of FIG. 7 may be adjusted for a desired metal density in transition zone 48. For example, if a lower metal density is desired, octagonal fill 82 may be made smaller or spaced more widely apart. For a higher metal density, octagonal fill 82 may be made larger or be spaced more closely. Octagonal fill 82 may be any suitable size. For example, octagonal fill 82 may have a width of 3 microns or more, 5 microns or more, 10 microns or more, or other suitable dimensions. The layout of FIG. 7 may be used for all metal layers 24 in a transition zone 48 or only for some metal layer 24 in transition zone 48. Each metal layer 24 in transition zone 48 may be formed with a different metal density, if desired.

Figure 8:
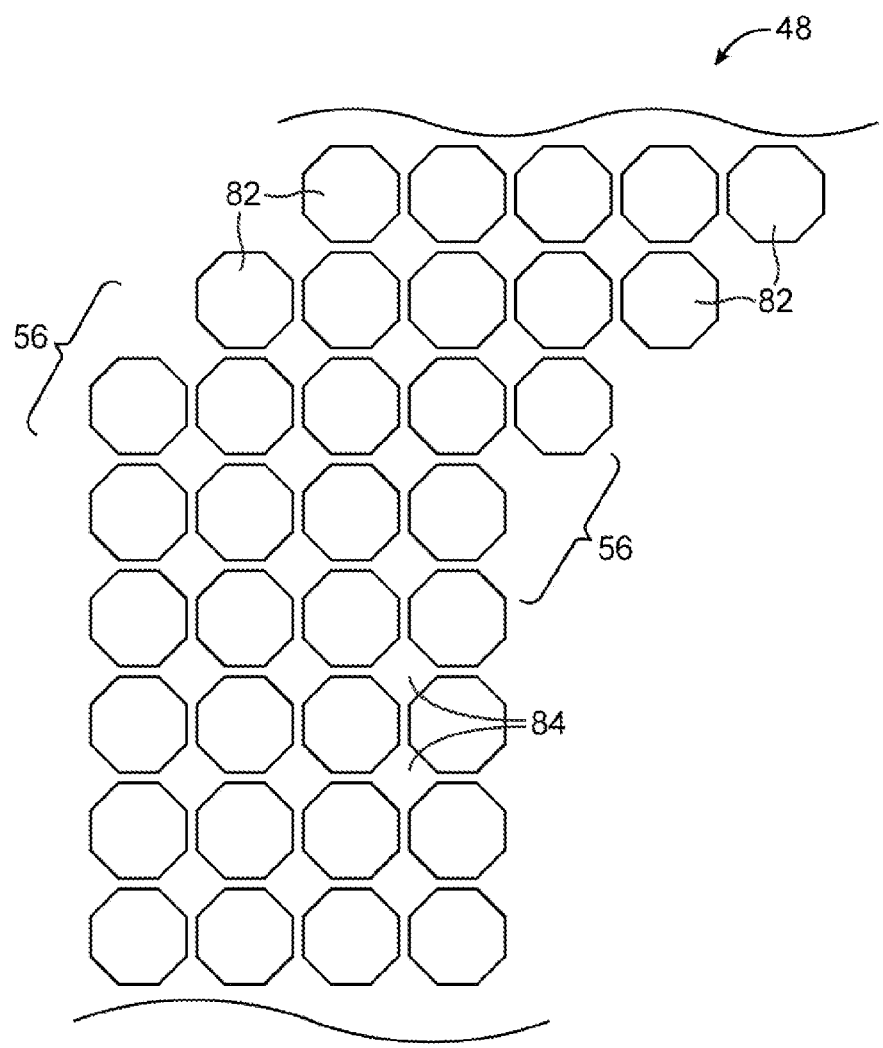
FIG. 8 is a top view of a transition zone containing octagonal dummy metal fill with a second layout in accordance with an embodiment of the present invention.

FIG. 8 is top view of another illustrative layout for transition zone 48 having eight-sided or octagonal fill 82 that may be used for a metal layers 24. Octagonal fill 82 may be octagonal metal fill 82 in a metal layer 24 (see, e.g., FIG. 1). Regions 84 between the octagonal metal fill 82 may be formed from a dielectric material such as silicon oxide. Octagonal fill 82 may be arranged in rows and columns. In the arrangement of FIG. 8, octagonal fill 82 are oriented at a different angle than in FIG. 7. In FIG. 8, the positioning of octagonal fill 82 at corners 56 of transition zone 48 is slightly different than that of FIG. 7, and in FIG. 8 no halved octagonal fill are used. The use of octagonal fill 82 in FIG. 8 enables a more uniform density around corners of a transition zone such as a substantially eight-sided or octagonal transition zone.

Figure 9:
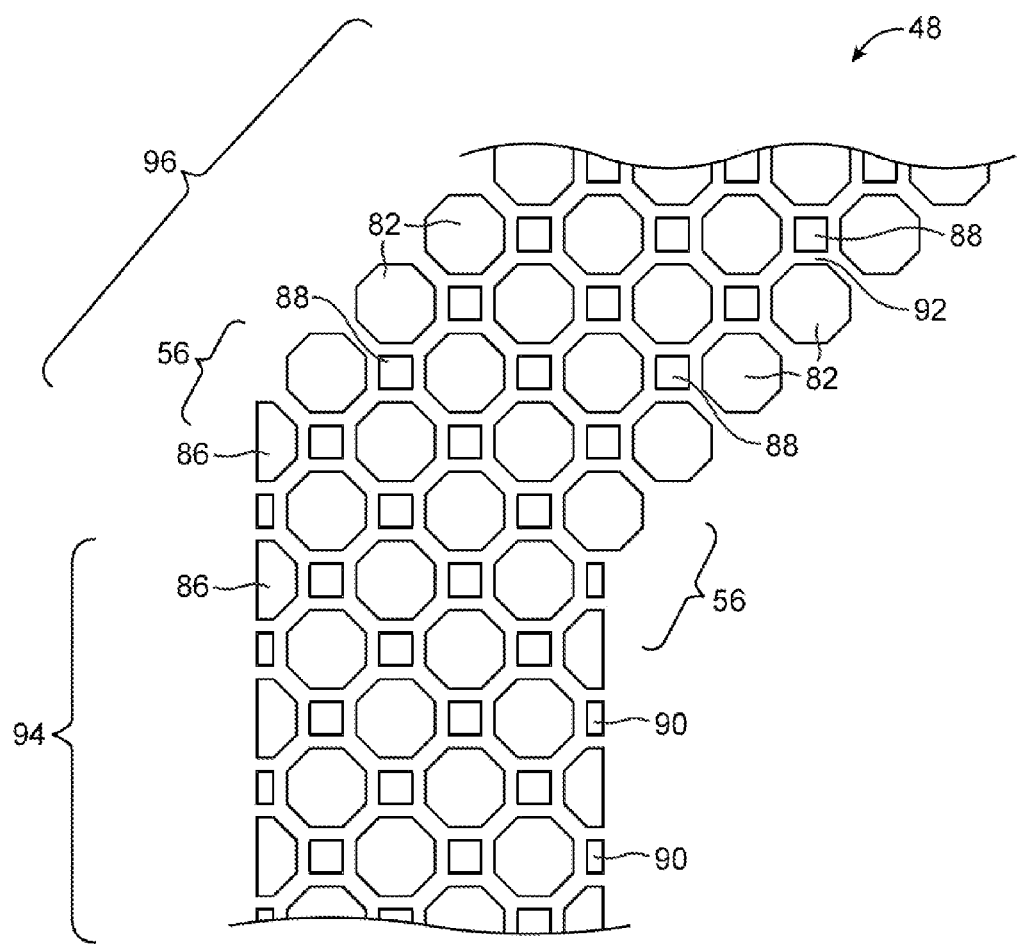
FIG. 9 is a top view of a transition zone having octagonal and square dummy metal fill with a first layout in accordance with an embodiment of the present invention.

FIG. 9 is a top view of another arrangement for transition zone 48 that may be used in a metal layer 24. Transition zone 48 may be substantially eight-sided or octagonal having corners 56 with angles that are greater than 90 degrees, such as 135 degrees.

In FIG. 9, octagonal fill structures 82 alternate with square (or rectangular) fill 88 in rows and columns. Octagonal fill 82 may be said to be tiled with square fill 88. In a metal layer 24, octagonal fill 82 and square fill 88 may be formed from metal such as copper. Regions 92 in between octagonal fill 82 and square fill 88 may be formed from a dielectric material such as silicon oxide. Using both octagonal fill 82 and square fill 88 may enable a higher metal density that arrangements having only octagonal fill 82, such as in the examples of FIGS. 7 and 8.

Octagonal fill 82 and square fill 88 in FIG. 9 are distributed so that one segment 94 of transition zone 48 contains halved octagonal fill 86 and halved square fill 90 at the borders of transition zone 48. Halved square fill 90 may be substantially rectangular. Another segment 96 of transition zone 48 might not have halved octagonal fill 86 or halved square fill 90. This arrangement of FIG. 9 is merely illustrative. The metal density of transition zone 48 in FIG. 9 may be adjusted by increasing or decreasing the sizes of octagonal fill 82 and square fill 88, and increasing or decreasing the sizes of oxide regions 92. Octagonal fill 82 may have a width of 3 microns or more, 5 microns or more, 10 microns or more, or other suitable width. Square fill 88 may have a width of 3 microns or more, 5 microns or more, 10 microns or more, or other suitable width. The layout of FIG. 9 may be used for all metal layers 24 in a transition zone 48, or may be used for only some metal layers 24 in a transition zone 48.

Figure 10:
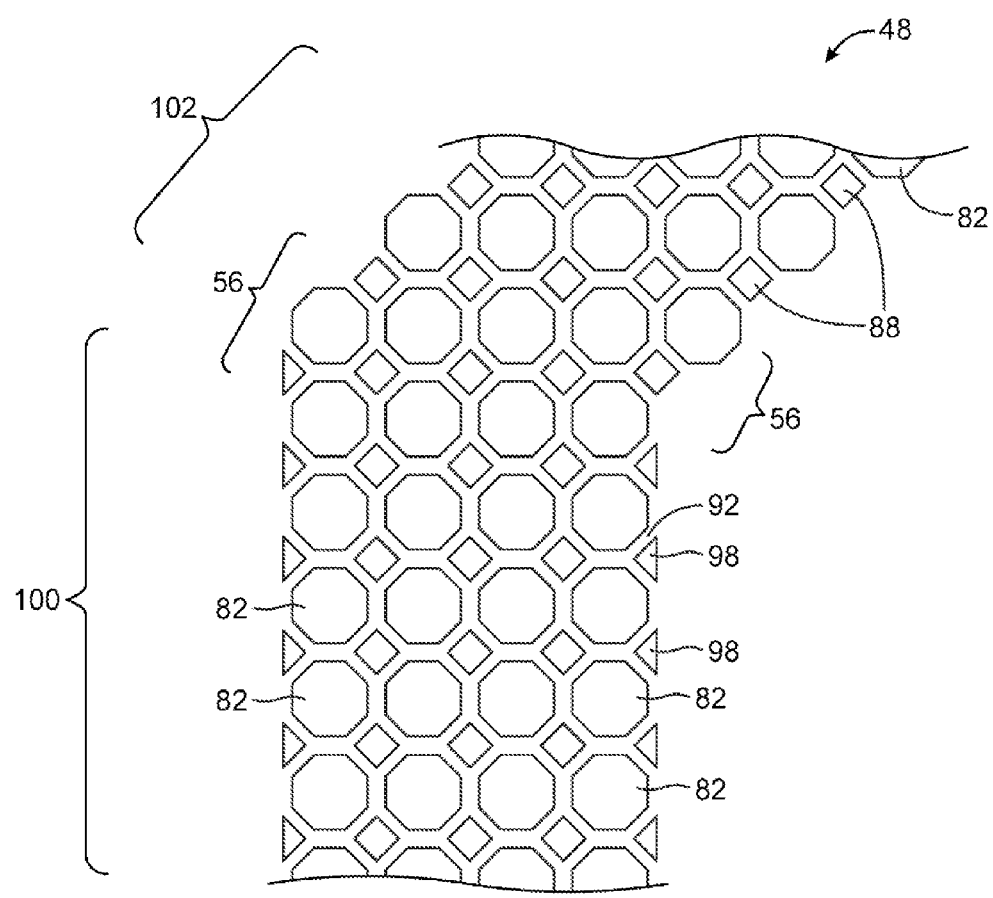
FIG. 10 is a top view of a transition zone having octagonal and square dummy metal fill with a second layout in accordance with an embodiment of the present invention.

FIG. 10 is a top view of another arrangement for transition zone 48 having corners 56 with angles that are greater than 90 degrees, such as 135 degrees. Transition zone 48 may be substantially eight-sided or octagonal. The arrangement of FIG. 10 may be used for a metal layer 24 of a dielectric stack 28 (see, e.g., FIG. 1). Transition zone 48 of FIG. 10 may have octagonal fill 82 alternating with (or tiled with) square (or rectangular) fill 88. In a metal layer 24, octagonal fill 82 and square fill 88 may be metal fill. Regions 92 between octagonal fill 82 and square fill 88 may be formed from a dielectric material such as silicon oxide.

In the arrangement of FIG. 10, one portion 100 of transition zone 48 may have halved square fill 98 near a border of transition zone 48. Halved square fill 98 may be halved diagonally so that fill 98 are triangular in shape.

Portion 102 of transition zone 48 might not have halved fill 98. This is merely illustrative. In general, any suitable arrangement of whole, halved, or sectioned octagonal or square fill may be used in transition zone 48. The sizes of octagonal fill 82, square fill 88, and oxide-filled regions 92 may be adjusted for a desired metal density.

Figure 11:
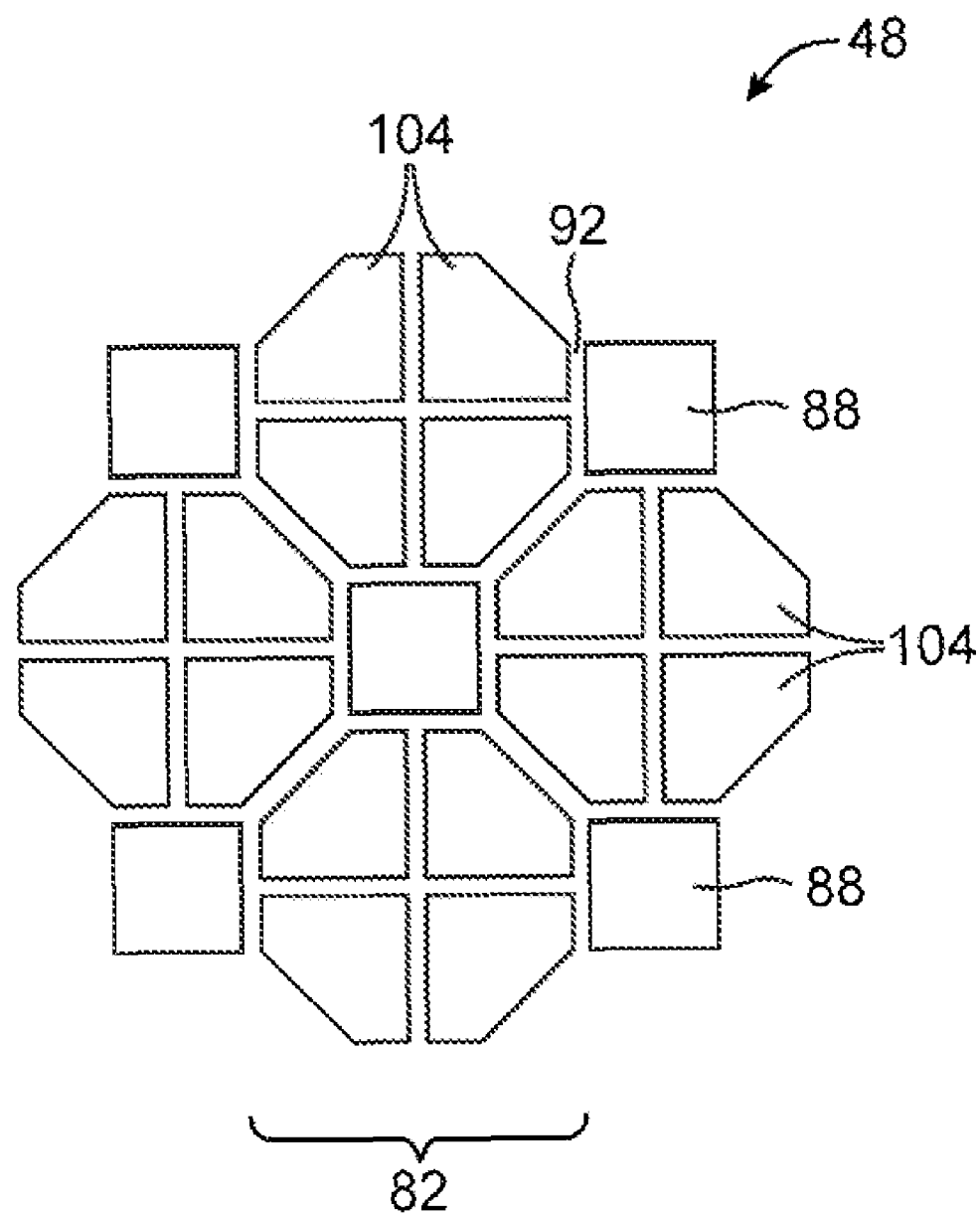
FIG. 11 is a top view of a transition zone having segmented octagonal dummy metal fill in accordance with an embodiment of the present invention.

If desired, octagonal fill may be sectioned, as shown in the example of FIG. 11. FIG. 11 shows octagonal fill 82 that has been quartered into sections 104. Sections 104 may be metal fill that is separated by dielectric material 92 such as silicon oxide. Sections 104 may be grouped together in fours to form a substantially octagonal shape 82. A quartered octagonal fill 82 may have a non-octagonal shape of a square with one corner cut off at a diagonal. Square fill 88 may be metal fill that alternates, or is tiled with each octagonal grouping of four sections 104. Alternatively, square fill 88 may be omitted, which may be suitable in cases where a lower metal density is desired. The sizes of sections 104 and square fill 88 (when square fill 88 are present) may be adjusted for a desired metal density. Sectional octagonal fill 104 may have a width of 3 microns or more, 5 microns or more, less than 15 microns, or other suitable width. Square fill 88 may have a width of 3 microns or more, 5 microns or more, 10 microns or more, or other suitable widths. Sectioned octagonal fill may be used in any suitable layout. For example, some or all of octagonal fill 82 in the layouts of FIGS. 6-10 may be sectioned into quarters or halves, if desired.

The layouts of FIGS. 6-11 for metal layers 24 in density transition zone 48 are merely illustrative. If desired, variations or combinations of the layouts in FIGS. 6-11 may be used. Metal layers 24 in density transition zone 48 may all have the same metal fill layout, or if desired, each metal layer 24 may have a different metal fill layout with a different metal density. If the same metal fill layout is used for each metal layer 24, the layouts may be aligned so that each piece of metal fill in a metal layer 24 is directly over or under the metal fill in other metal layers 24. Or, if desired, metal fill layouts may be offset in each metal layer 24. If desired, there may be metal layers 24 in density transition zone 48 that do not have metal fill. In some cases, such as when active components regions 63 surrounding transition zone 48 have a varying metal density, it may be desirable to have metal layer 24 in transition zone 48 that has varying metal density at different areas of the metal layer 24.

Polysilicon layer 22 and substrate 20 in density transition zones 48 may also be formed to have densities intermediate between those of adjacent inductor regions 48 and active component regions 63. Polysilicon and a dielectric material such as silicon oxide may be used in a polysilicon layer such as polysilicon layer 22 (see, e.g., FIG. 1). Substrate 20 in transition zone 48 may have shallow trench isolation (STI) regions interspersed with non-STI regions, also known as substrate regions. The non-STI-regions may also be known as "active" regions, although typically no active components are formed in transition zone 48. It may be desirable to have polysilicon layer 22 formed such that the polysilicon fill is not directly above non-STI regions in substrate 20—i.e. so that polysilicon fill in polysilicon layer 22 is directly above shallow trench isolation regions in substrate 20.

Figure 12:
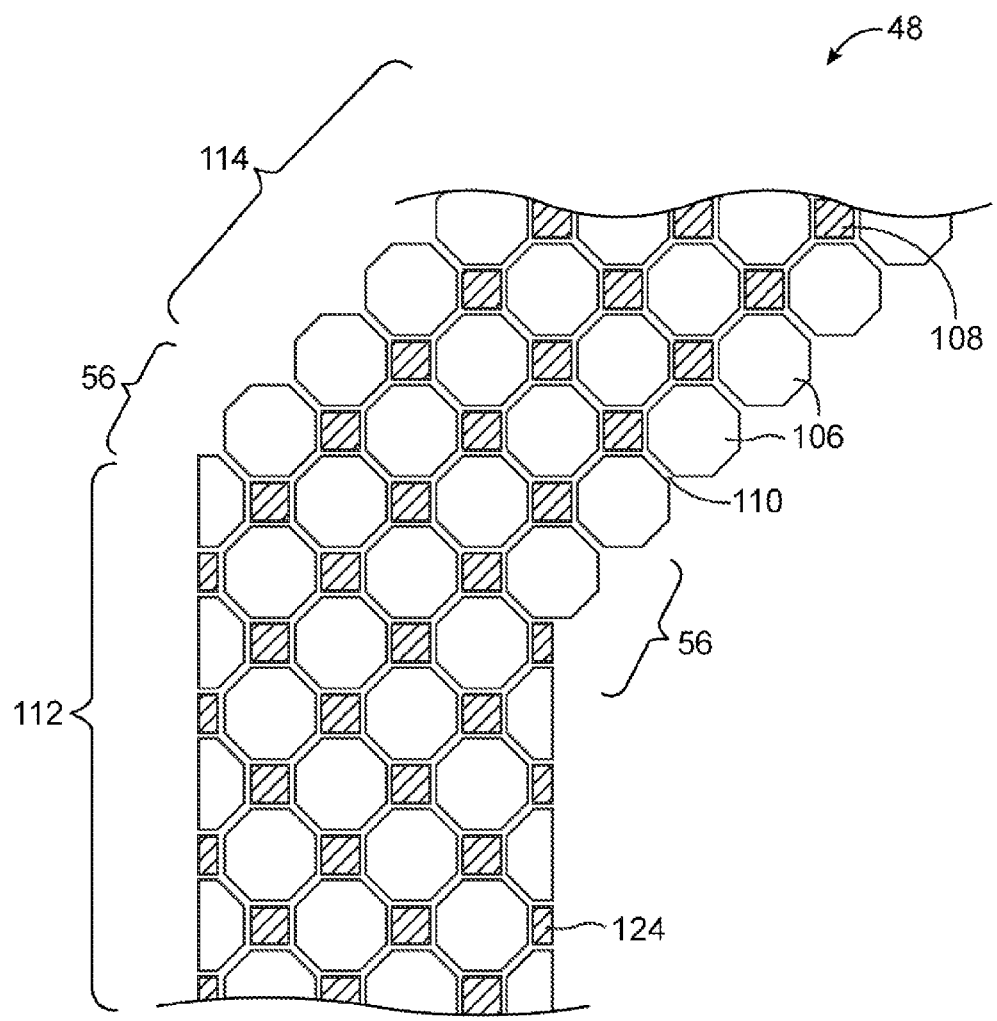
FIG. 12 is a top view of a transition zone having a first layout of octagonal and square regions that may be used for substrate and polysilicon layers in accordance with an embodiment of the present invention.

FIG. 12 is a top view of an arrangement that may be used for polysilicon 22 and substrate layers 20 in a transition zone 48. In the example of FIG. 12, layouts for polysilicon layer 22 and substrate layers 20 are superimposed for illustrative purposes. In the example of FIG. 12, squares 108 may be square polysilicon fill 108 in polysilicon layer 22. Octagons 106 may be eight-sided or octagonal non-STI regions 106 in substrate 20. In polysilicon layer 22, area between square polysilicon fill 108 may be formed from a dielectric material such as silicon oxide. The dielectric material would therefore fill sections including octagons 106 and border regions 110, forming connected octagons. In substrate 20, shallow trench isolation regions may separate octagonal non-STI regions 106. Shallow trench isolation in substrate 20 will fill regions including square regions 108 and border regions 110. In the example of FIG. 12, there is no overlap between polysilicon fill 108 in polysilicon layer 22 and non-STI regions 106 in substrate 20. The presence of border 110 may ensure that there is no overlap.

The octagon and square layout of FIG. 12 is suitable for forming corners 56 of transition zone 48 that may be 135 degree corners. In the example layout of FIG. 12, one portion 112 of transition zone 48 have halved octagons and halved squares at the borders of transition zone 48. The halved squares may be substantially rectangular. Another portion 114 of transition zone 48 may have only whole octagons and whole squares. The layout of FIG. 12 is merely illustrative. In general, any arrangement of whole or partial octagons and squares (or rectangles) may be used. The sizes of octagons and squares in FIG. 12 may be adjusted for desired polysilicon and shallow trench isolation densities. Octagonal non-STI regions 106 may have a width of 3 microns, 5 microns, 10 microns, less than 15 microns, less than 20 microns, or any suitable width. Square polysilicon fill 108 may have a width of 3 microns, 5 microns, 10 microns, less than 5 microns, less than 10 microns, or any suitable width.

Figure 13:
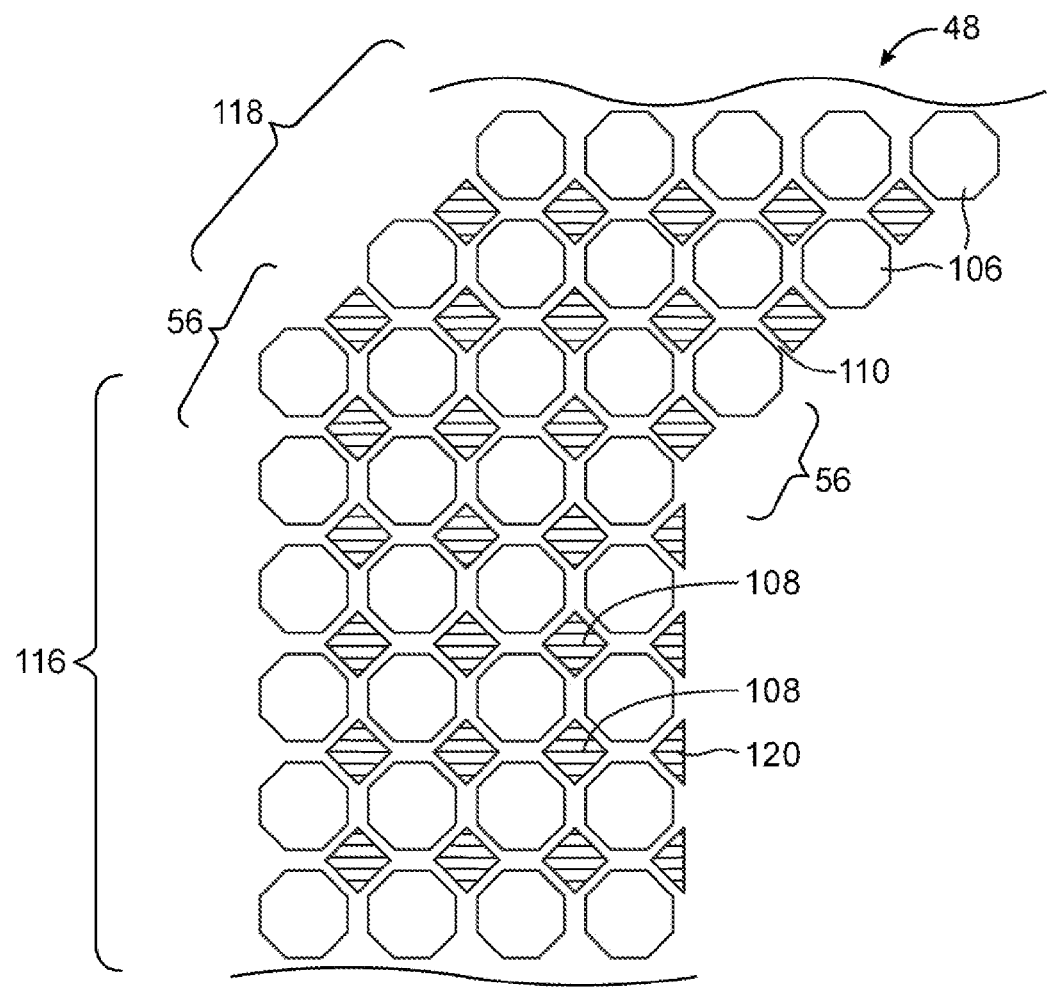
FIG. 13 is a top view of a transition zone having a second layout of octagonal and square regions that may be used for substrate and polysilicon layers in accordance with an embodiment of the present invention.

FIG. 13 is a top view of another layout for polysilicon layer 22 and substrate 20 in transition zone 48. Transition zone 48 may be substantially octagonal with corners 56 with 135 degree angles. Polysilicon layer 22 may have squares 108 of polysilicon fill but may otherwise be formed of a dielectric material such as silicon oxide. Substrate 20 may have octagons 106 of non-STI regions but may otherwise be formed from shallow trench isolation (STI). Polysilicon fill 108 therefore may lie directly above shallow trench isolation regions in substrate 20.

In the example of FIG. 13, portion 116 of transition zone 48 may have squares that are halved into triangles 120 near a border of transition zone 48. Portion 118 may have only whole squares 108 and whole octagons 106. This is merely illustrative. In general, transition zones may have any suitable number of whole or partial octagons and squares (or rectangles). The sizes of octagons 106 and squares 108 and their separation may be adjusted to desired densities.

Figure 14:
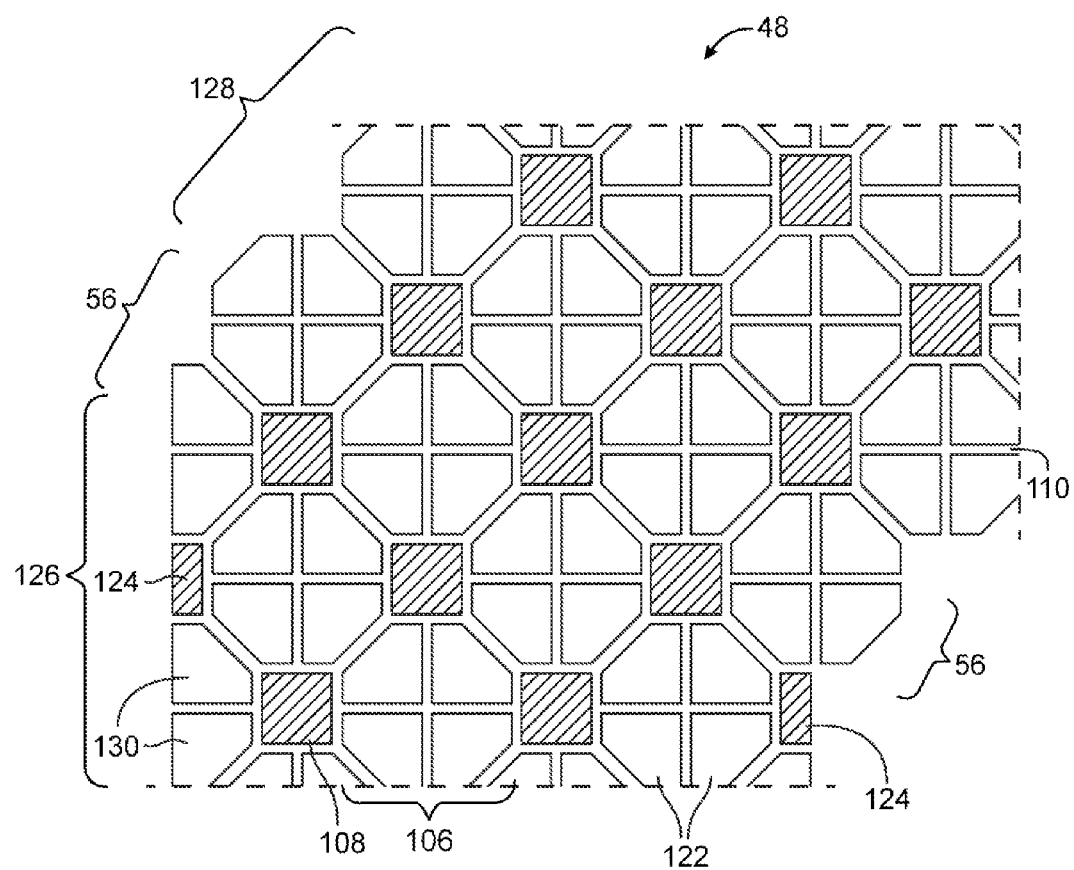
FIG. 14 is a top view of a transition zone having a first layout of segmented octagonal and square regions that may be used for substrate and polysilicon layers in accordance with an embodiment of the present invention.

FIG. 14 is another example layout for polysilicon layer 22 and substrate 20 in a transition zone 48 having angles 56 that may be 135 degree angles. Polysilicon layer 22 may have squares 108 of polysilicon and may otherwise be formed of silicon oxide. Substrate 20 may have non-STI regions in the shape of quartered octagons 106 but may have shallow trench isolation in all other areas, including border regions 110 in between quartered octagons 106 and underneath polysilicon squares 108 in polysilicon layer 108. Four quartered octagon regions 122 may form a substantially octagonal shape 106. Each quartered octagon 122 may have a non-octagonal shape and may resemble a square with one corner cut off. In the example of FIG. 14, portion 126 of transition zone 48 may have halved squares 124 that are substantially rectangular and also "halved" octagonal regions that are formed of only two quartered octagonal pieces (such as pieces 130). Portion 128 may contain only whole squares 108 and "whole" octagons 106 each containing four quartered octagon regions 122. The arrangement of FIG. 13 is merely illustrative.

Figure 15:
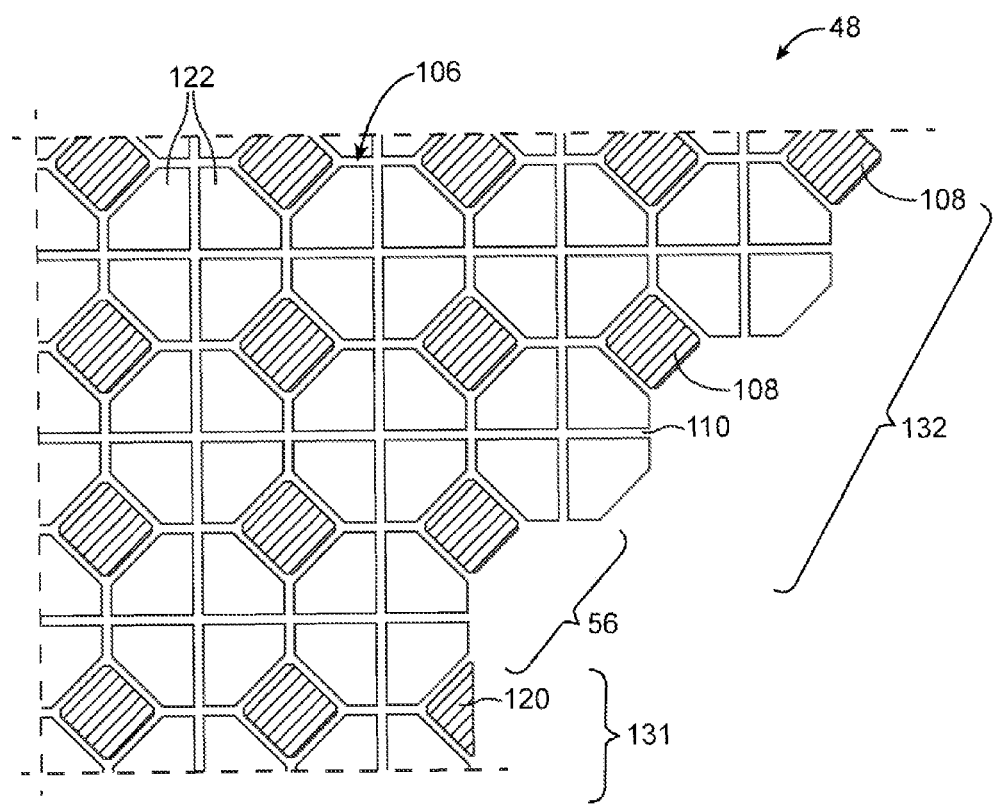
FIG. 15 is a top view of a transition zone containing a second layout of segmented octagonal and square regions that may be used in substrate and polysilicon layers in accordance with an embodiment of the present invention.

FIG. 15 is a top view of another layout for polysilicon layer 22 and substrate 20 in a transition zone 48 having corners 56 that may be 135 degree corners. Similar to FIG. 14, the polysilicon layer 22 has squares 108 of polysilicon but may otherwise be filled with a dielectric material such as silicon oxide. Substrate 20 may have non-STI regions in the form of quartered octagons 122 that form octagonal regions 106 but may have shallow trench isolation (STI) formed in all other areas of substrate 20, including border 110 between octagonal sections 122.

The layout of FIG. 15 may have halved squares of polysilicon that form triangles 120, such as in a lower region 131 near a border of transition zone 48. Other regions, such as an upper region 132 of FIG. 15, might not have triangles 120. This is merely illustrative. The sizes and separation of squares 108 and pieces 122 may be adjusted to implement desired densities in transition zone 48.

The arrangements for polysilicon layer 22 of substrate 20 in transition zone 48 of FIGS. 12-15 are merely illustrative. If desired, variations and combinations of the layouts of FIGS. 12-15 are also possible. If desired, polysilicon layer 22 may have a polysilicon fill layout of FIGS. 12-15 while substrate 20 does not have a particular density fill layout—e.g., substrate 20 may have only shallow trench isolation or non-STI regions, or substrate 20 may have another treatment. If desired, polysilicon layer 22 may also have polysilicon fill layouts in the arrangements of FIGS. 7-11. If desired, polysilicon layer 22 may be left without a particular density fill layout (e.g., polysilicon layer 22 might have only dielectric material) while substrate 20 might have a non-STI region/shallow trench isolation layout of FIGS. 7-15. Density fill layouts for polysilicon layer 22 and substrate 20 may be used in conjunction with metal fill layouts for metal layers 24. Or if desired, density fill layouts for polysilicon layer 22 and substrate 20 may be used while metal layers 24 are filled with only dielectric material. Metal fill layouts of FIGS. 7-11 may be also be used in metal layers 24 without polysilicon 22 and substrate 20 having the polysilicon and substrate layouts of FIGS. 12-15. If desired, other combinations and variations may also be possible.

Figure 16:
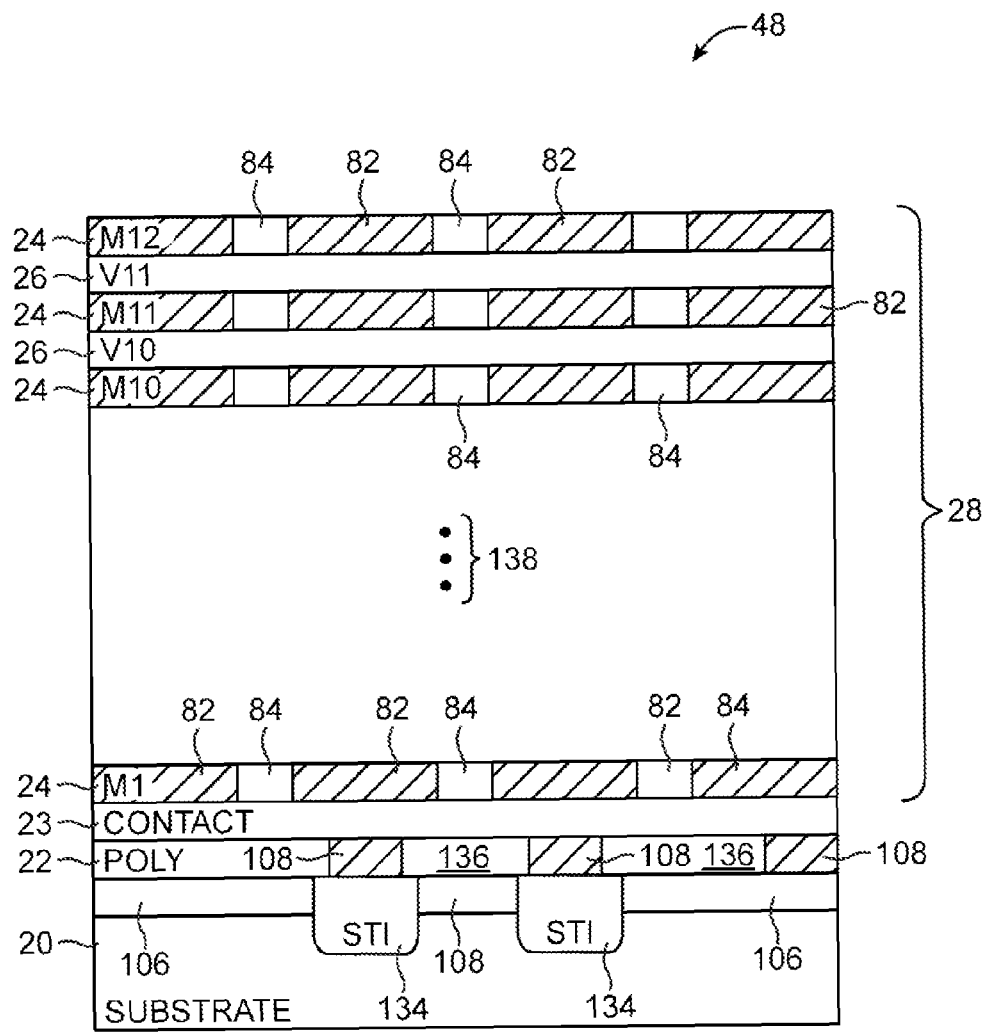
FIG. 16 is a cross sectional side view of a transition zone in which metal fill is aligned across metal layers in accordance with an embodiment of the present invention.

A cross section of an illustrative transition zone 48 is shown in FIG. 16. Polysilicon layer 22 and substrate 20 may have the arrangement of FIGS. 12-15. Substrate 20 may have octagonal non-STI regions 106, separated by shallow trench isolation (STI) regions 134. Polysilicon layer 22 may have square polysilicon regions 108 that are situated above shallow trench isolation regions 134 such that there is not overlap between polysilicon regions 108 and non-STI regions 106 in substrate 20. Polysilicon layer 22 may be otherwise formed of a dielectric material 136 such as silicon oxide. If desired, contact layer 23 may also be formed with a density fill pattern such as the patterns of FIG. 11-15.

Metal layers 24 of dielectric stack 28 may have the arrangements of FIGS. 7-11. Octagonal regions 82 (or octagonal and square regions, if the arrangements of FIGS. 9-11 are used) of metal may be separated by regions 84 of dielectric material such as silicon oxide. Additional metal layers 24 and via layers 26 are designated by dots 138. In the example of FIG. 16, metal regions 82 in each metal layer 24 are shown as being aligned with other metal layers 24, such that metal region 82 in metal layer M12 is directly over metal region 82 in metal layer M11. Such an arrangement is merely illustrative. Metal region 82 in metal layer M1 is shown is being directly over polysilicon region 108 in polysilicon layer 22. This arrangement is merely illustrative.

Figure 17:
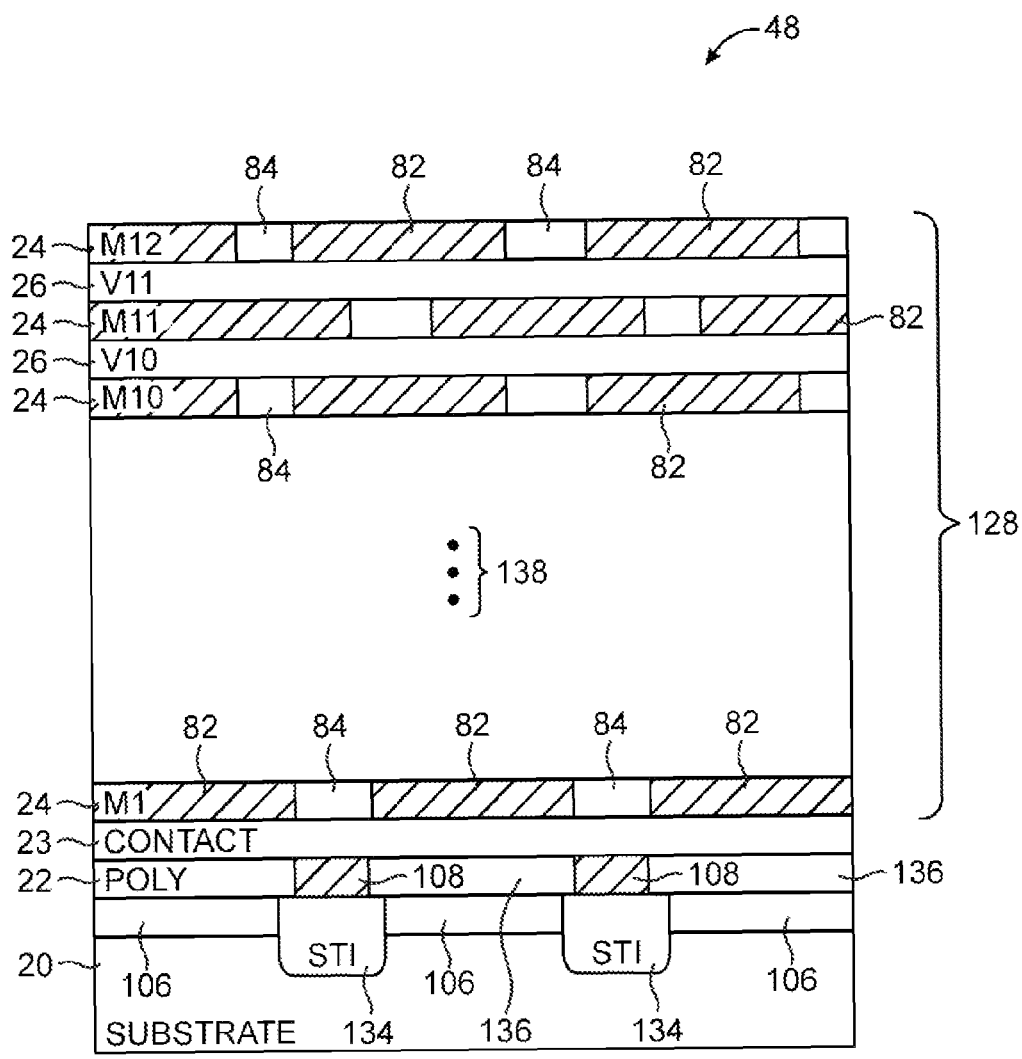
FIG. 17 is a cross sectional side view of a transition zone in which metal fill is offset across different metal layers in accordance with an embodiment of the present invention.

FIG. 17 is a cross section of another illustrative transition zone 48. Polysilicon layer 22 has polysilicon regions 108 separated by silicon oxide 136. Polysilicon regions 108 are directly over shallow trench isolation (STI) regions 134 in substrate 20 and do not contact non-STI regions 106 in substrate 20. Metal layers 24 may have octagonal or square regions 82 separated by a dielectric material such as silicon oxide 84. Additional metal layers 24 and via layers 26 are denoted by dots 138. If desired, contact layer 23 may also be formed with a density fill pattern such as the patterns of FIG. 11-15.

In the example of FIG. 17, metal regions 82 in each metal layer 24 are shown as being offset from metal regions 82 in metal layers 24 that are directly above and below. For example, metal regions 82 in metal layer M11 are shown as being offset from metal regions 82 in metal layers M12 and M10. Metal regions 82 in metal layer M1 are shown as being offset from polysilicon regions 108 in polysilicon layer 22. The arrangement of FIG. 17 is merely illustrative. In general, any combination of dummy fill layouts may be used, and if desired each metal layer 24 may have a different metal fill layout with a different metal density.

Transition zone 48 of FIGS. 11-17 need not be used only with inductor 48. If desired, transition zone 48 may be formed anywhere else on integrated circuit 10 where a buffer zone is needed or where there is a significant change in densities from one region on an integrated circuit to another. For example transition zone 48 may be used with metal-insulator-metal (MIM) capacitors, analog circuit blocks, or other integrated circuit components.

Layouts similar to the layouts of FIGS. 11-17 may also be used for transition zones with non-octagonal geometries. For example, layouts using octagonal fill may be used for transition zones that have boundaries with non-perpendicular angles. If desired, octagonal fill may also be used for transition zones having boundaries with perpendicular angles. If desired, dummy fill structures with other geometries may be used, such as hexagonal or six-sided dummy fill structures or ten-sided dummy fill structures. For example, hexagonal dummy fill structures may be used in transitions zones surrounding hexagonal spiral inductors. In general, dummy fill structures having non-perpendicular angles may be suitable for transition zones that have non-perpendicular boundaries (oblique-angle boundaries). Dummy fill structures having angles greater than 90 degrees (oblique angles), or having more than four sides, may be used for transition zones having boundaries with angles greater than 90 degrees, or for transition zones with more than four sides.

The foregoing is merely illustrative of the principles of this invention and various modifications can be made by those skilled in the art without departing from the scope and spirit of the invention.

What is claimed is:

1. An integrated circuit, comprising:
    a spiral inductor formed in metal layers of a dielectric stack;
    octagonal dummy fill structures surrounding the spiral inductor, wherein the octagonal dummy fill structures comprise octagonal metal fill structures formed in the metal layers of the dielectric stack; and
    square metal fill structures formed in the metal layers of the dielectric stack that form an alternating transition zone pattern with the octagonal metal fill structures.

2. The integrated circuit defined in claim 1, wherein at least one of the octagonal dummy fill structures comprises four separate fill structures that together form the octagonal dummy fill structure.

3. An integrated circuit, comprising:
    a spiral inductor formed in metal layers of a dielectric stack; and
    octagonal dummy fill structures surrounding the spiral inductor, wherein the octagonal dummy fill structures comprise octagonal metal fill structures formed in the metal layers of the dielectric stack and wherein the octagonal metal fill structures in each of the metal layers of the dielectric stack are aligned with the octagonal metal fill structures in other metal layers among the metal layers of the dielectric stack.

4. An integrated circuit, comprising:
a spiral inductor formed in metal layers of a dielectric stack; and
octagonal dummy fill structures surrounding the spiral inductor, wherein the octagonal dummy fill structures comprise octagonal metal fill structures formed in the metal layers of the dielectric stack and wherein the octagonal metal fill structures in at least a first of the metal layers of the dielectric stack are offset from the octagonal metal fill structures in a second of the metal layers of the dielectric stack.

5. An integrated circuit, comprising:
a spiral inductor formed in metal layers of a dielectric stack; and
octagonal dummy fill structures surrounding the spiral inductor, wherein the octagonal dummy fill structures comprise octagonal substrate regions in a substrate, the integrated circuit further comprising:
shallow trench isolation regions in the substrate between the octagonal substrate regions.

6. The integrated circuit defined in claim 5, further comprising:
rectangular polysilicon fill structures in a polysilicon layer above the substrate, wherein the rectangular polysilicon fill structures are directly above the shallow trench isolation regions in the substrate.

7. An integrated circuit, comprising:
a spiral inductor formed in metal layers of a dielectric stack; and
octagonal dummy fill structures surrounding the spiral inductor, wherein the octagonal dummy fill structures are located in a transition zone surrounding the spiral inductor and wherein the transition zone has inner and outer boundaries that are substantially octagonal.

8. The integrated circuit defined in claim 7, further comprising:
halved octagonal fill structures at one of the inner and outer boundaries.

9. The integrated circuit defined in claim 7, further comprising:
triangular fill structures at one of the inner and outer boundaries.

10. The integrated circuit defined in claim 7, further comprising rectangular fill structures at one of the inner and outer boundaries.

11. An integrated circuit, comprising:
a spiral inductor formed in metal layers of a dielectric stack; and
octagonal dummy fill structures surrounding the spiral inductor, wherein the octagonal dummy fill structures are arranged in rows and columns.

12. An integrated circuit, comprising:
a spiral inductor; and
dummy fill structures surrounding the spiral inductor, wherein each dummy fill structure has non-perpendicular edges and wherein the dummy fill structures comprise octagonal substrate regions in a substrate that are separated by shallow trench isolation regions.

13. The integrated circuit defined in claim 12, wherein at least some of the dummy fill structures each comprise at least eight of the non-perpendicular edges.

14. The integrated circuit defined in claim 12, wherein the dummy fill structures comprise octagonal dummy metal fill structures.

15. The integrated circuit defined in claim 12, further comprising:
rectangular polysilicon fill structures in a polysilicon layer over the substrate, wherein the rectangular polysilicon fill structures are located directly above the shallow trench isolation regions.

16. An integrated circuit, comprising:
an inductor; and
octagonal dummy fill structures surrounding the spiral inductor, wherein each of the octagonal dummy fill structures comprises a group of four non-octagonal dummy fill structures.

17. The integrated circuit defined in claim 16 wherein the groups of four non-octagonal dummy fill structures each comprise a group of four non-octagonal dummy metal fill structures formed in metal layers in a dielectric stack.

18. The integrated circuit defined in claim 16, further comprising:
square dummy metal fill structures in metal layers in a dielectric stack that alternate with the groups of four non-octagonal dummy metal fill structures.

19. The integrated circuit defined in claim 16 wherein the groups of four non-octagonal dummy fill structures each comprise a group of four substrate regions in a substrate that are separated by shallow trench isolation regions.

20. The integrated circuit defined in claim 19, further comprising:
rectangular polysilicon fill structures in a polysilicon layer over the substrate, wherein the octagonal dummy fill structures are located in a density transition zone that surrounds the inductor.

* * * * *